US012614603B2

(12) United States Patent
Verma et al.

(10) Patent No.: US 12,614,603 B2
(45) Date of Patent: Apr. 28, 2026

(54) AREA SAVING HIGH COVERAGE FAST DIAGNOSIS MEMORY SCAN DESIGN

(71) Applicant: STMicroelectronics International N.V., Geneva (CH)

(72) Inventors: Praveen Kumar Verma, Greater Noida (IN); Christophe Lecocq, Varces (FR); Yagnesh Dineshbhai Vaderiya, Greater Noida (IN); Anuj Dhillon, New Delhi (IN); Cedric Escallier, Seyssinet (FR); Harsh Rawat, Faridabad (IN); Kedar Janardan Dhori, Ghaziabad (IN)

(73) Assignee: STMicroelectronics International N.V., Geneva (CH)

( * ) Notice: Subject to any disclaimer, the term of this patent is extended or adjusted under 35 U.S.C. 154(b) by 86 days.

(21) Appl. No.: 18/635,569

(22) Filed: Apr. 15, 2024

(65) Prior Publication Data

US 2024/0363187 A1     Oct. 31, 2024

Related U.S. Application Data

(60) Provisional application No. 63/461,981, filed on Apr. 26, 2023.

(51) Int. Cl.
| | |
|---|---|
| *G11C 29/32* | (2006.01) |
| *G11C 29/02* | (2006.01) |
| *G11C 29/46* | (2006.01) |

(52) U.S. Cl.
CPC ............ *G11C 29/46* (2013.01); *G11C 29/022* (2013.01); *G11C 29/32* (2013.01); *G11C 2029/3202* (2013.01)

(58) Field of Classification Search
CPC ....... G11C 29/46; G11C 29/022; G11C 29/32; G11C 2029/3202; G11C 29/10; G11C 29/38; G11C 29/44
See application file for complete search history.

(56) References Cited

U.S. PATENT DOCUMENTS

| | | | | |
|---|---|---|---|---|
| 9,021,323 B1* | 4/2015 | Dastidar | ........ | G01R 31/318544 |
| | | | | 714/727 |
| 2004/0210808 A1* | 10/2004 | Motika | .......... | G01R 31/318569 |
| | | | | 714/726 |

(Continued)

FOREIGN PATENT DOCUMENTS

| | | |
|---|---|---|
| JP | 200453341 A | 2/2004 |
| WO | 2012031362 A1 | 3/2012 |
| WO | 2013173192 A1 | 11/2013 |

OTHER PUBLICATIONS

Bin A'Ain, Abu Khari, et al.: "Hybrid Built-In Self Test (BIST) for Sequential Circuits," 2009 Conference on Innovative Technologies in Intelligent Systems adn Industrial Applications, pp. 236-239.

*Primary Examiner* — Mohammed A Bashar

(74) *Attorney, Agent, or Firm* — Crowe & Dunlevy LLC

(57) ABSTRACT

A memory system disclosed herein features left and/or right memory banks, with left and/or right input/output (IO) blocks aligned with the memory banks for managing data input and output. A control section, situated between the left and right input/output blocks, oversees memory operations, receives control signals, and performs stuck-at testing. The control section includes fault detection logic designed to output a first logic value (e.g., logic low) if logic values at each of its external inputs are identical, but output a second logic value (e.g., logic high) if not. The fault detection logic is capable of detecting stuck-at faults in the external inputs by performing both stuck-at-0 and stuck-at-1 testing. If only stuck-at-0 or stuck-at-1 faults are detected, the fault detection logic can pinpoint those faults by iteratively changing input values at each of its external inputs and observing the output of the fault detection logic.

23 Claims, 12 Drawing Sheets

(56)                    References Cited

U.S. PATENT DOCUMENTS

| 2008/0091996 | A1 | 4/2008 | Chung |
| 2010/0017760 | A1 | 1/2010 | Kapur et al. |
| 2013/0258786 | A1 | 10/2013 | Chakravarty |

* cited by examiner

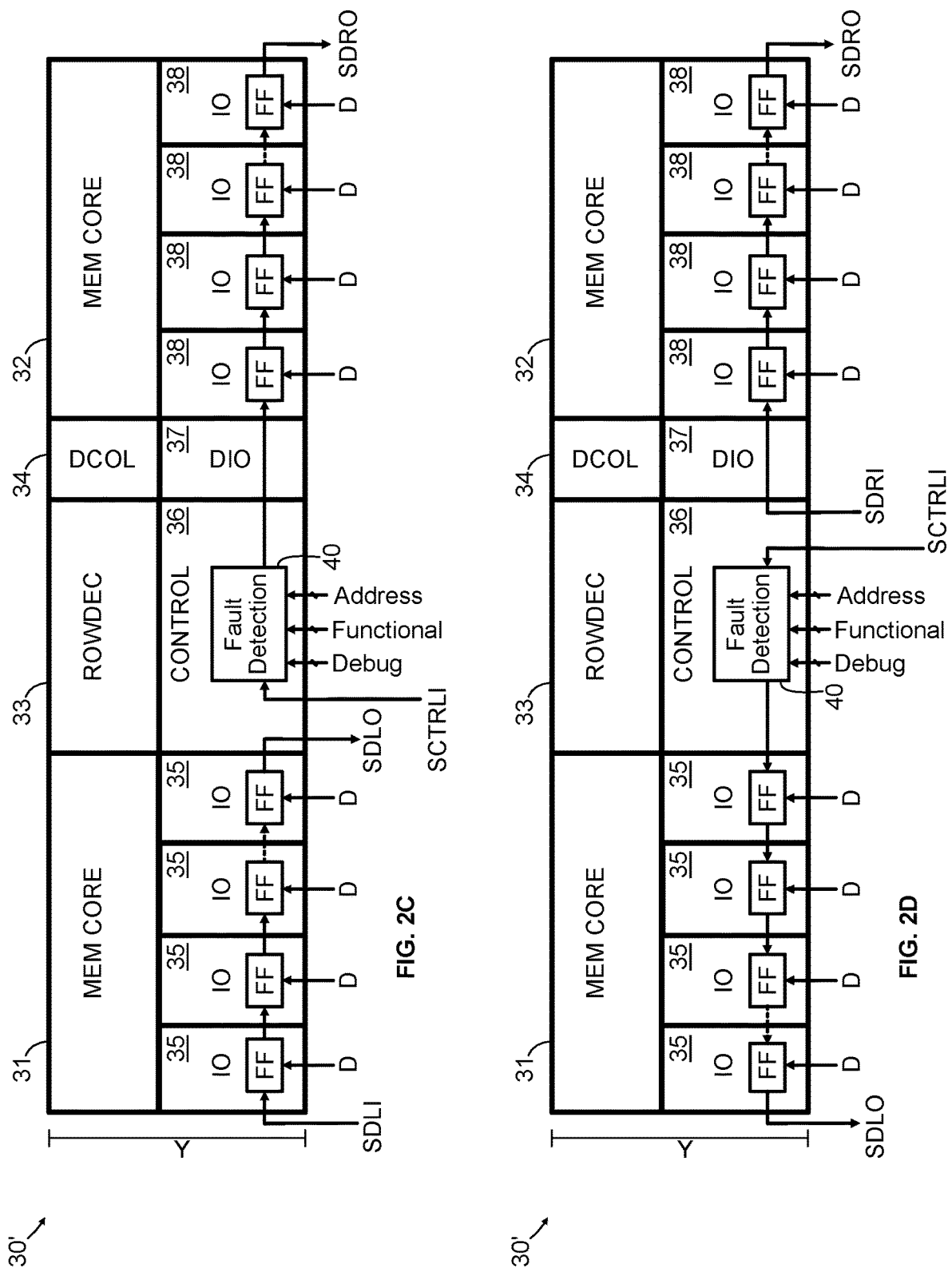

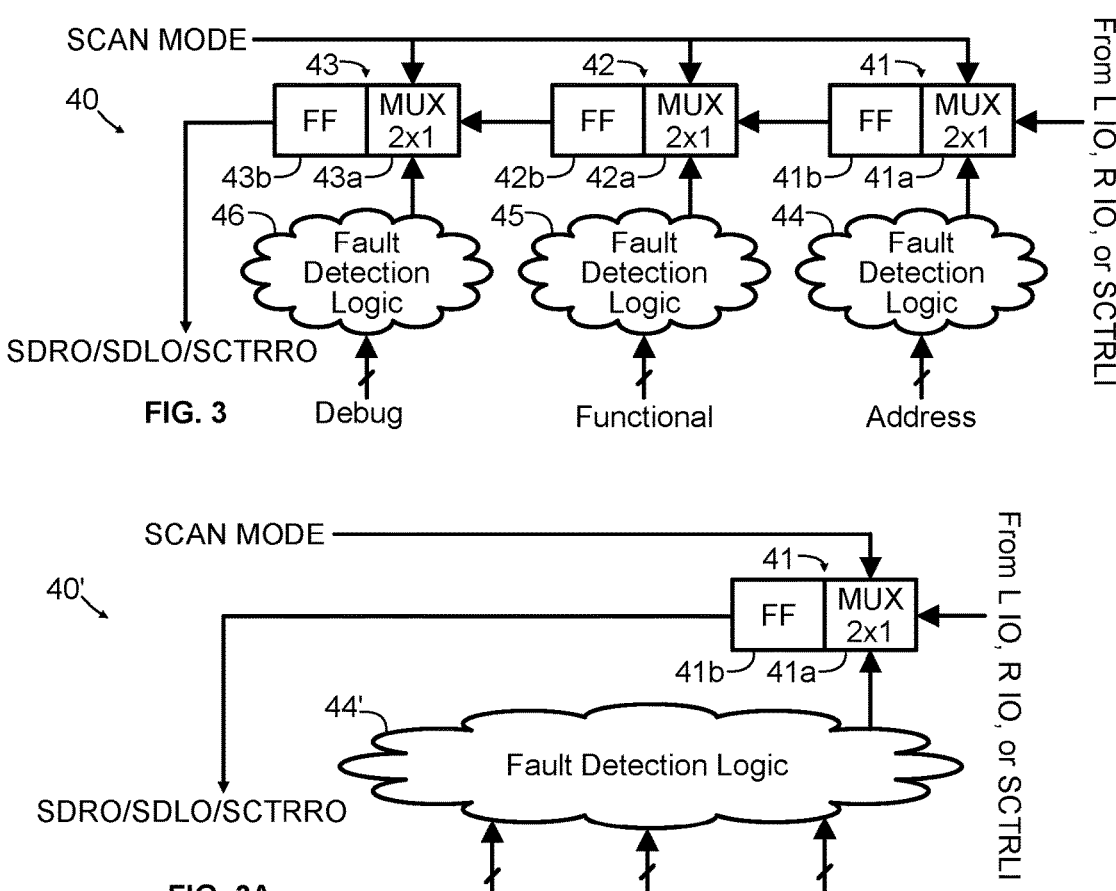
FIG. 3
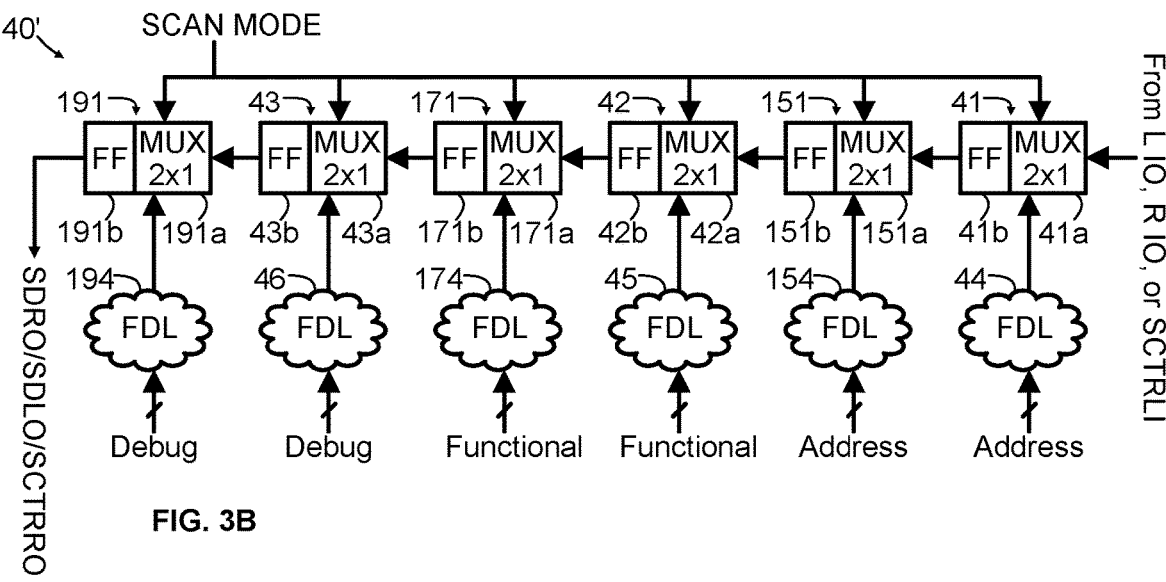
FIG. 3A
FIG. 3B

AREA SAVING HIGH COVERAGE FAST DIAGNOSIS MEMORY SCAN DESIGN

CROSS REFERENCE TO RELATED APPLICATION

This application claims priority to United States Provisional Application For Patent No. 63/461,981, filed Apr. 26, 2023, the content of which is incorporated by reference in its entirety.

TECHNICAL FIELD

This disclosure is related to the field of integrated circuit (IC) testing and, in particular, to a design-for-testability (DFT) circuit for detecting stuck-at faults in the control section of the memory of a system-on-chip (SOC) design with reduced area overhead.

BACKGROUND

Design-for-testability (DFT) is an aspect of integrated circuit (IC) development aimed at providing ICs that can be effectively and efficiently tested for manufacturing defects, such as stuck-at faults. Stuck-at faults occur when a digital signal in the circuit is permanently stuck at a logic high or low value due to a manufacturing defect, potentially causing incorrect operation of the IC.

System-on-chip (SOC) designs integrate multiple functional units, such as processors, memory, and peripheral devices, into a single IC. In order to verify the correct operation and reliability of these complex designs, comprehensive testing is to be performed. DFT techniques, such as scan testing, have been developed to address these testing requirements. Scan testing involves reconfiguring the internal flip flops of the IC into a shift-register-like structure called a scan chain, allowing test patterns to be shifted in and out to detect certain stuck-at faults effectively.

Consider the diagrammatical layout view of a conventional SOC memory 10 shown in FIG. 1. This memory 10 is present within an SOC, but the rest of the SOC is not shown for brevity. The memory 10 includes two memory cores, namely a left bank 11 and a right bank 12. Positioned between these two memory cores is a row decoder 13, which serves the function of selecting a specific row within the memory banks 11 and 12 based on the provided address input. This enables access to the desired data stored within the memory cores.

A dummy column 14 is located between the row decoder 13 and the right bank 12 and aids in accounting for process variations and therefore maintaining consistent and stable performance during read and write operations performed on the memory banks 11 and 12. A dummy input/output (IO) block 17 is positioned below and aligned with the dummy column 14 and serves a similar purpose.

Input/output (IO) blocks 15 are positioned below and aligned with the left bank 11, while input/output (IO) blocks 18 are positioned below and aligned with the right bank 12. The IO blocks 15 and 18 are responsible for handling the data input and output for the left and right banks 11 and 12.

A control section 16 is situated between the IO block 15 and the dummy IO block 17 and plays a role in managing the memory operations. In particular, the control section 16 receives control signals, such as address signals and functional commands (e.g., write enable, chip select, etc.), and uses them to control the functioning of the memory banks 11 and 12. The control section 16 also receives debug commands and data for testing on-silicon input signal integrity.

To enable scan testing, the IO blocks 15 and 18 include flip flops FF which can be formed into scan chains. In the IO block 15 when performing scan testing, data is scanned in through a SDLI (scan-data-left input) input and shifted out through a SDLO (scan-data-left output). Similarly, in the IO block 18 when performing scan testing, data is scanned in through a SDRI (scan-data-right input) input and shifted out through a SDRO (scan-data-right output).

The control section 16 includes a flip flop FF for each input, and these flip flops can likewise be formed into a scan chain. When performing scan testing, data is scanned in through a SCTRLI (scan-control-input) input and shifted out through a SCTRRO (scan-control-output). As the number of inputs increases, the number of flip flops required in the control section 16 grows proportionally. This increase in the number of flip flops directly translates into a larger area consumption, as each flip flop occupies a certain amount of silicon area on the IC.

As the area occupied by the flip flops within the control section 16 increases, the height of the control section 16 must be increased to accommodate them—this is shown in FIG. 1 as the height of the memory is Y+$\Delta$Y, as opposed to the height being Y if these flip flops were not present.

This height increase can lead to several challenges for designers. First, it impacts the overall size of the memory 10, potentially making it larger than desired and therefore reducing available area within the SOC for other components. Second, the increased size of the control section 16 can create challenges related to the routing of signals, power distribution, and heat dissipation, as the density of components within the control section increases. Third, if the memory 10 is to occupy a rectangular area on the SOC die, unused spaces 19 to the left and right of the control block 16 (underneath the IO blocks 15, 17, and 18) will be present, as the components within the IO blocks 15, 17, and 18 themselves do not require additional area. Typically, only a small amount of these unused spaces 19 (e.g., 2%-5%, if any) may be used for components other than the memory 10.

Furthermore, the area overhead and increased height of the control section 16 can have implications on the manufacturing process and costs. The larger the SOC, the fewer devices can be fabricated on a single wafer, which can increase the overall production cost per unit. Additionally, a larger control section 16 may lead to a higher probability of manufacturing defects, impacting yield and reliability.

In summary, the use of flip flops for each input in the control section 16 of the memory 10 for conventional DFT techniques results in a significant increase in area and height, leading to various design and manufacturing challenges. To address these concerns, there is a need for an improved DFT approach that minimizes area overhead while maintaining effective stuck-at fault detection capabilities.

SUMMARY

A memory system disclosed herein includes a left memory bank and a right memory bank, with left and right input/output (IO) blocks aligned with the respective memory banks for handling data input and output. A control section is situated between the left and right input/output blocks and is responsible for managing memory operations, receiving control signals, and performing stuck-at testing. Within the control section, there is a fault detection logic that is configured to output a first logic value if each of its external inputs are identical and output a second logic value if not.

This fault detection logic can detect stuck-at faults in the external inputs by performing both stuck-at-0 and stuck-at-1 testing, and if only one type (stuck-at-0 or stuck-at-1) of fault is detected, the fault detection logic can pinpoint at which external input the stuck-at-fault is occurring.

The fault detection logic is configured to pinpoint stuck-at-0 faults by iteratively changing input values at each of the external inputs and observing the output of the fault detection logic. The iterative process for pinpointing stuck-at-0 faults involves receiving one input value as the second logic value and the remainder of input values as the first logic value, observing the output of the fault detection logic, and iterating which one of the input values is at the second logic value.

Similarly, the fault detection logic is also configured to pinpoint stuck-at-1 faults by iteratively changing input values at each of the external inputs and observing the output of the fault detection logic. The iterative process for pinpointing stuck-at-1 faults involves receiving one input value as the first logic value and the remainder of input values as the second logic value, observing the output of the fault detection logic, and iterating which one of the input values is at the first logic value.

The memory system's fault detection logic can take various forms.

For example, the fault detection logic may include a NAND gate having inputs connected to each of the external inputs and an output, a first NOR gate having inputs also connected to each of the external inputs and an output, an inverter having an input connected to the output of the NAND gate and an output, and a second NOR gate having inputs connected to the outputs of the inverter and the first NOR gate, with an output of the second NOR gate forming the output of the fault detection logic.

As an alternative, the fault detection logic can include an AND gate having inputs connected to each of the external inputs and an output, a first NOR gate having inputs also connected to each of the external inputs and an output, and a second NOR gate having inputs connected to the outputs of the AND gate and the first NOR gate, with an output of the second NOR gate forming the output of the fault detection logic.

As yet another alternative, the fault detection logic can include an AND gate having inputs connected to each of the external inputs and an output, an OR gate having inputs also connected to each of the external inputs and an output, an inverter having an input connected to the output of the OR gate and an output, and a NOR gate having inputs connected to the outputs of the inverter and the AND gate, with an output of the NOR gate forming the output of the fault detection logic.

As a further alternative, the fault detection logic may include a NAND gate having inputs connected to each of the external inputs and an output, a NOR gate having inputs also connected to each of the external inputs and an output, an inverter having an input connected to the output of the NAND gate and an output, and an OR gate having inputs connected to the outputs of the inverter and the NOR gate, wherein an output of the OR gate forms the output of the fault detection logic.

As an additional alternative, the fault detection logic may include an AND gate having inputs connected to each of the external inputs and an output, a NOR gate having inputs also connected to each of the external inputs and an output, and an OR gate having inputs connected to the outputs of the AND gate and the NOR gate, with an output of the OR gate forming the output of the fault detection logic.

As another further alternative, the fault detection logic may include an AND gate having inputs connected to each of the external inputs and an output, an OR gate having inputs also connected to each of the external inputs and an output, an inverter having an input connected to the output of the OR gate and an output, and an OR gate having inputs connected to the outputs of the inverter and the AND gate, with an output of the OR gate forming the output of the fault detection logic.

The external inputs to the fault detection logic can include debug input pins, functional input pins, and/or address input pins. The first and second logic values used in the fault detection logic can be either a logic low and a logic high, or a logic high and a logic low, respectively.

Also described herein is a method for testing a memory device, which includes a first memory core, a first IO block associated with the first memory core, and a control block. The method involves performing stuck-at-0 testing and stuck-at-1 testing using a fault detection circuit within the control block. In stuck-at-0 testing, each input value to the fault detection circuit is set to a second logic value, causing the circuit to output a first logic value to indicate a lack of stuck-at-0 faults and the second logic value to indicate a stuck-at-fault. In stuck-at-1 testing, each input value to the fault detection circuit is set to the first logic value, causing the circuit to output the second logic value to indicate a stuck-at-1 fault and the first logic value to indicate a lack of stuck-at-1 faults.

If stuck-at-1 faults are not indicated, the method pinpoints indicated stuck-at-0 faults by iteratively changing the input values and observing the output of the fault detection circuit. In particular, pinpointing the indicated stuck-at-0 faults includes setting one input value to the second logic value and other input values to the first logic value, then iterating until the output of the fault detection circuit changes to the second logic value.

If stuck-at-0 faults are not indicated, the method pinpoints indicated stuck-at-1 faults by iteratively changing the input values and observing the output of the fault detection circuit. In particular, pinpointing the indicated stuck-at-1 faults includes setting one input value to the first logic value and other input values to the second logic value, then iterating until the output of the fault detection logic circuit changes to the second logic value.

Additionally, the method may include receiving an output of a final flip flop in a scan chain of one of the IO blocks at the control block and shifting that output out through an external output during scan testing of the IO block.

The first and second logic values used in the method can be either a logic low and a logic high, or a logic high and a logic low, respectively.

Also disclosed herein is a memory device that includes a first memory core, a first input/output (IO) block associated with the first memory core, and a control block. The first IO block contains flip flops configurable into a scan chain. The control block features first fault detection logic connected to receive external inputs, a first flip flop with a data input and a data output, and a first multiplexer. The first fault detection logic deasserts its output when each external input has the same logic value and asserts its output otherwise. The first multiplexer passes either the output of the scan chain of the first IO block or the output of the first fault detection logic to the data input of the first flip flop, responding to a scan mode signal.

The external inputs can include debug input pins, functional input pins, and/or address input pins.

The data output of the first flip flop may be connected to an external output. The memory device can also feature a second memory core and a second IO block associated with the second memory core. The second IO block includes flip flops configurable into a scan chain, with the output of the last flip flop in the scan chain of the second IO block connected to an external output.

In some embodiments of the memory device, external inputs can include debug inputs, functional inputs, and address inputs. The first fault detection logic receives address inputs and its output indicates whether a stuck-at fault is present in the address inputs. The control block may also include second and third fault detection logic, second and third flip flops, and second and third multiplexers. The data output of the third flip flop is connected to an external output.

The first and second logic values used in the memory device can be either a logic low and a logic high, or a logic high and a logic low, respectively.

BRIEF DESCRIPTION OF THE DRAWINGS

FIGS. 2A-2L are diagrammatical layout views of alternative configurations of memories disclosed herein for use within a SOC.

FIG. 3 is a block diagram of the fault detection blocks of FIGS. 2 and 2A-2L.

FIGS. 3A-3H are block diagrams of alternative configurations of the fault detection blocks of FIGS. 2 and 2A-2L.

DETAILED DESCRIPTION

The following disclosure enables a person skilled in the art to make and use the subject matter described herein. The general principles outlined in this disclosure can be applied to embodiments and applications other than those detailed above without departing from the spirit and scope of this disclosure. It is not intended to limit this disclosure to the embodiments shown, but to accord it the widest scope consistent with the principles and features disclosed or suggested herein.

Figures 1, 2:
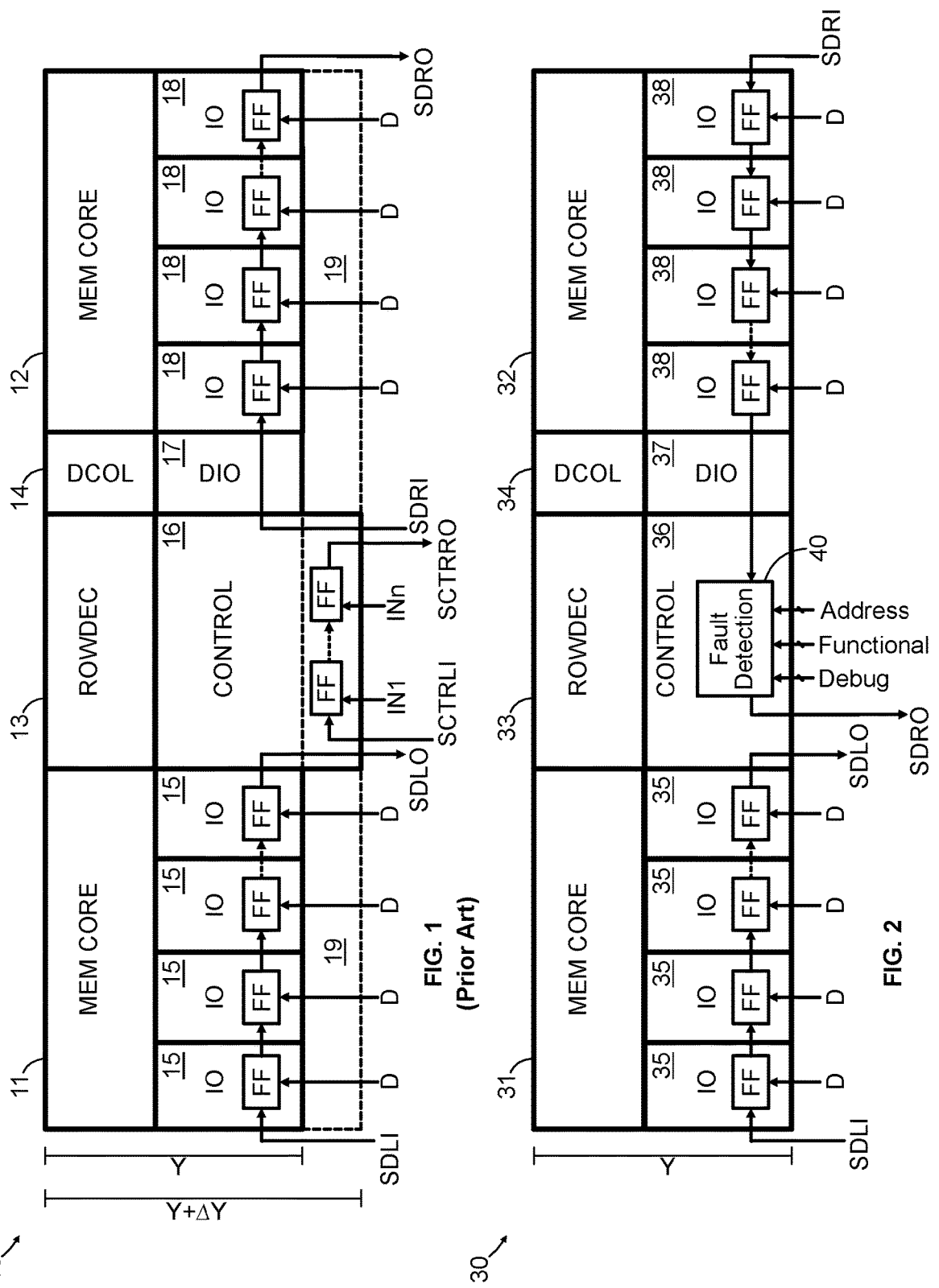
FIG. 1 is a diagrammatical layout view of a conventional memory for use within a SOC.
FIG. 2 is a diagrammatical layout view of a memory disclosed herein for use within a SOC.

Now described with reference to FIG. 2 is a memory 30 which utilizes a relatively compact (in terms of area consumption) fault detection block within its control section 36 to eliminate the additional height $\Delta Y$ required by the prior art designs described above.

The memory 30 is present within an SOC, but the rest of the SOC is not shown for brevity. The memory 30 includes two memory cores, namely the left bank 31 and the right bank 32. Positioned between these two memory cores 31 and 32 is a row decoder 33, which serves the function of selecting a specific row within the memory banks 31 and 32 based on the provided address input. This enables access to the desired data stored within the memory cores.

A dummy column 34 is located between the row decoder 33 and the right bank 32 and aids in accounting for process variations and therefore maintaining consistent and stable performance during read and write operations performed on the memory banks 31 and 32. A dummy input/output (IO) block 37 is positioned below and aligned with the dummy column 34 and serves a similar purpose.

Input/output (IO) blocks 35 are positioned below and aligned with the left bank 31, while input/output (IO) blocks 38 are positioned below and aligned with the right bank 32. The IO blocks 35 and 38 are responsible for handling the data input and output for the left and right banks 31 and 32.

A control section 36 is situated between the IO block 35 and the dummy IO block 37 and plays a role in managing the memory operations. In particular, the control section 36 receives control signals, such as address signals and functional commands (e.g., write enable, chip select, etc.), and uses them to control the functioning of the memory banks 31 and 32. The control section 36 also receives debug commands and data for testing on-silicon input signal integrity.

To enable scan testing, the IO blocks 35 and 38 include flip flops FF which can be formed into scan chains. In the IO block 35 when performing scan testing, data is scanned in through a SDLI (scan-data-left input) input and shifted out through a SDLO (scan-data-left output). Similarly, in the IO block 38 when performing scan testing, data is scanned in through a SDRI (scan-data-right input) input. However, the output of the final flip flop in the scan chain in the IO block 38 is provided to a scan chain present in the control section 36.

The control section 36 includes a fault detection block 40 which receives the output of the final flip flop in the scan chain of the IO block 38 and shifts that output out through its own output, which, when scan testing involving the IO block 38 is performed, acts as the SDRO (scan-data-right output). The fault detection block 40 includes multiple inputs for receiving debug data, multiple inputs for receiving functional inputs, and multiple inputs for receiving addresses. The fault detection block 40 performs stuck-at testing on its inputs in a fashion that enables it to not only indicate the presence of stuck-at-0 and stuck-at-1 faults, but to locate at which input the fault occurs.

In the example described above, the fault detection block 40 receives the output of the final flip flop in the scan chain of the IO block 38 and shifts that output out through its output during scan testing involving the IO block 38, while the IO block 35 has its own output for scan testing.

However, as should be understood, this may be the opposite in other embodiments. For example, as shown in FIG. 2A, the fault detection block 40 may instead receive the output of the final flip flop in the scan chain of the IO block 35 and shift that output out through its output during scan testing involving the IO block 35, while the IO block 38 has its own output for scan testing.

Figures 2A, 2B:
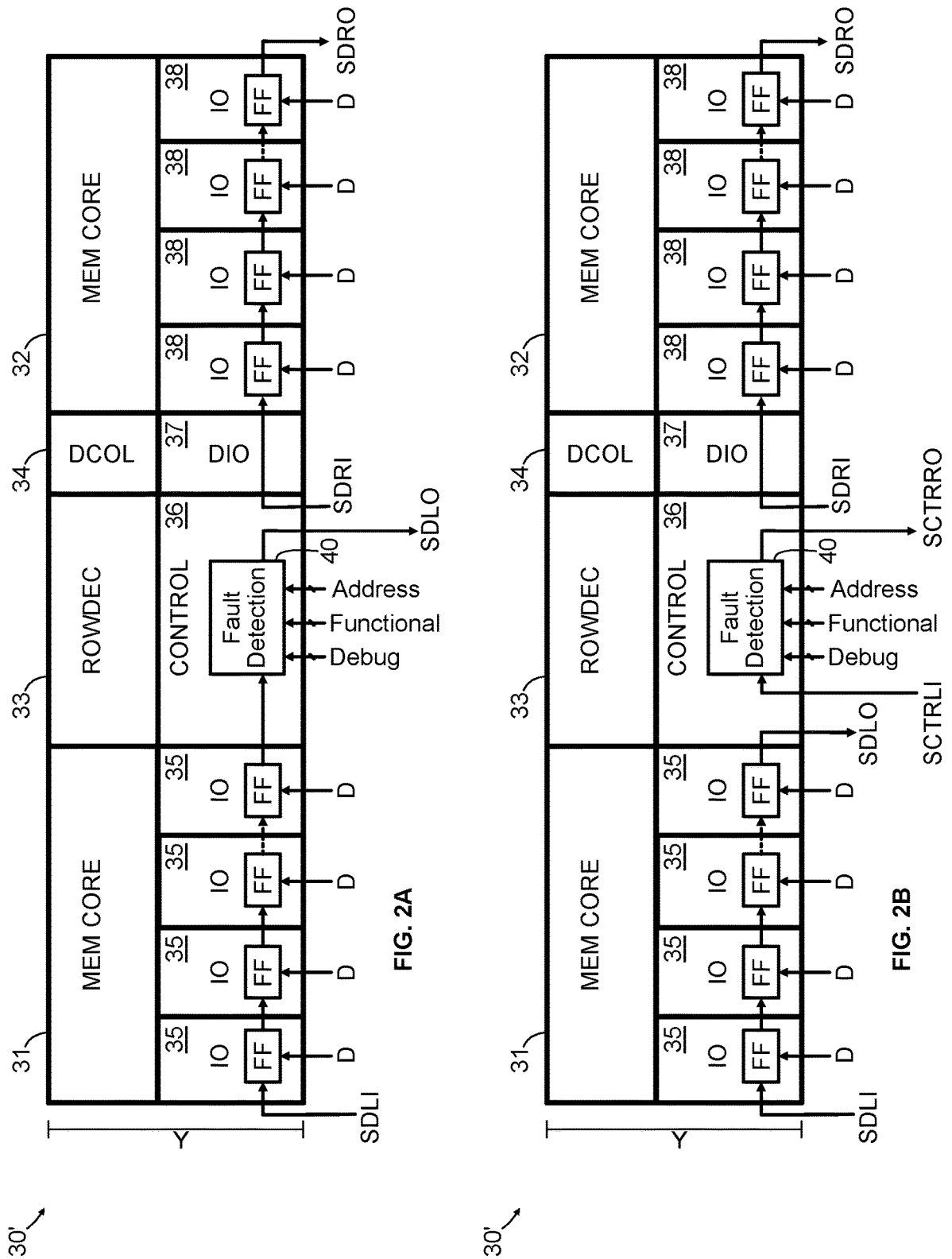

As another variation, IO blocks 35 and 38 may each have their own outputs during scan testing, while the fault detection block 40 has its own input and output for scan testing, as shown in FIG. 2B.

Still further, the input to one of the IO blocks 35 and 38 may be shifted in through the fault detection block 40 and shifted out through the output of the corresponding IO block. For example, see FIG. 2C, where the input to IO block 38 is shifted in through the fault detection block 40, and see FIG. 2D, where the input to IO block 35 is shifted in through the fault detection block.

Figures 2E, 2F:
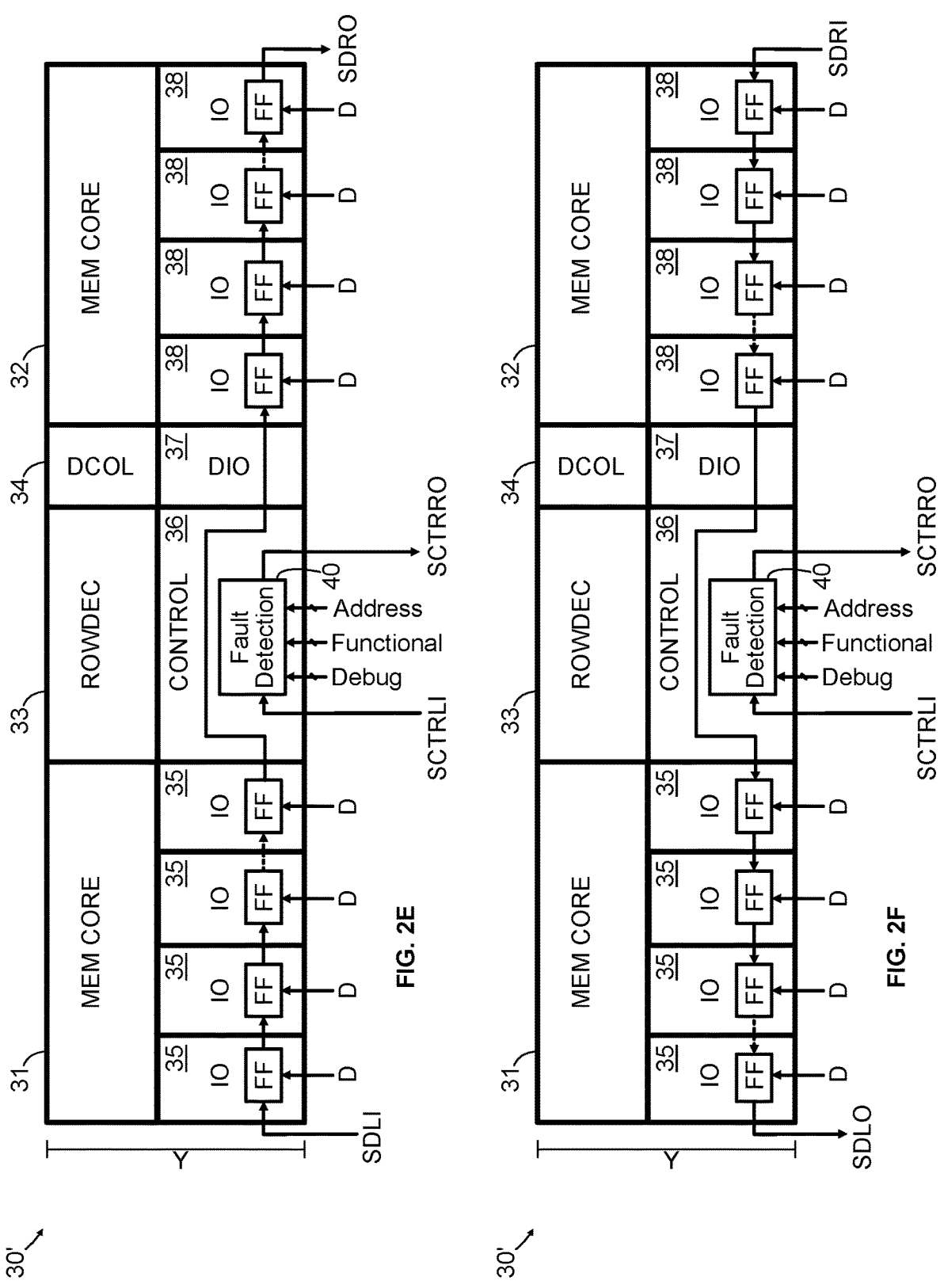

As another configuration, the flip flops of IO blocks 35 and 38 may be chained together such that the output of one of the IO blocks is the input to the other IO blocks while the fault detection block 40 has its own input and output. For example, see FIG. 2E, where the output of IO block 35 is shifted to the input of IO block 38, and see FIG. 2F, where the output of IO block 38 is shifted to the input of IO block 35.

Figures 2G, 2H:
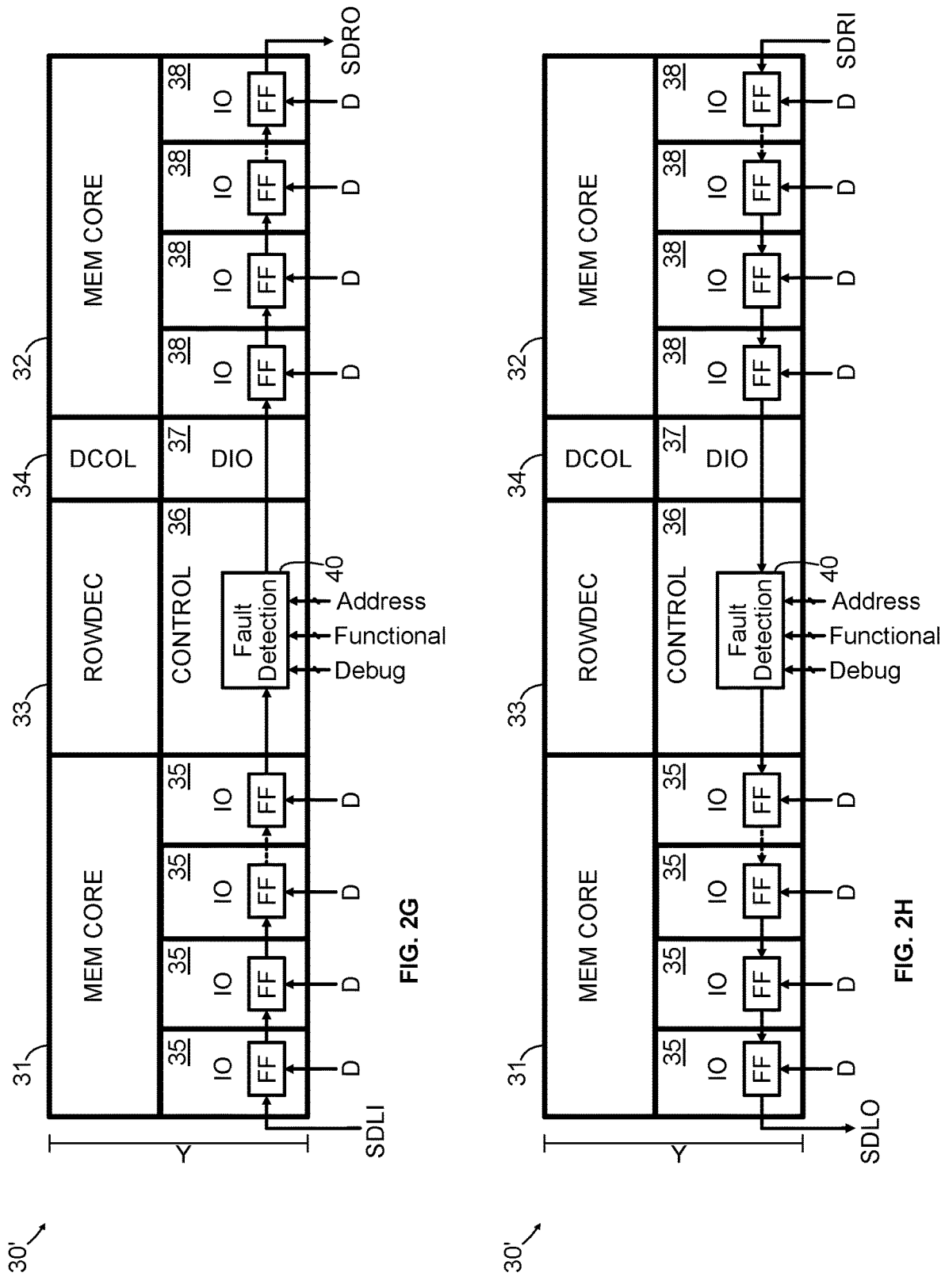

As a further variation of this, the output of one of the IO blocks 35 and 38 may be shifted through the fault detection block 40 before reaching the input of the other of the IO blocks 35 and 38. For example, see FIG. 2G, where the output of IO block 35 is shifted through fault detection block 40 to reach the input of IO block 38, and see FIG. 2H, where the output of IO block 38 is shifted through fault detection block 40 to reach the input of IO block 35.

Figures 2I, 2J:
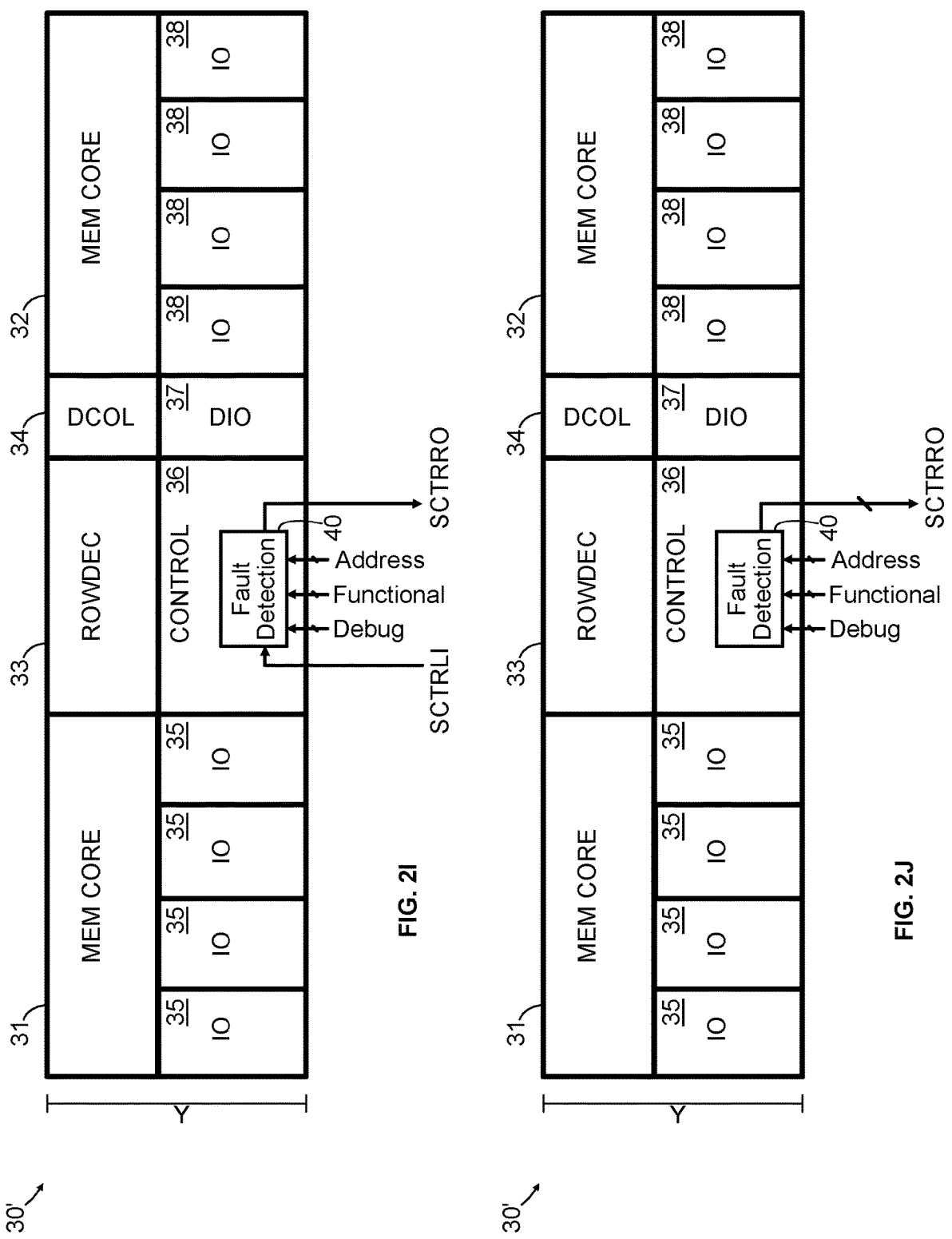

As opposed to the above examples, the IO blocks 35 and 38 may lack flip flops used to form scan chains, as shown in FIG. 2I.

The fault detection block 40 in the control section 36 may lack flip flops used to form scan chains, in an embodiment in which the IO blocks 35 and 38 also lack such flip flops, as shown in FIG. 2J.

Figures 2K, 2L:
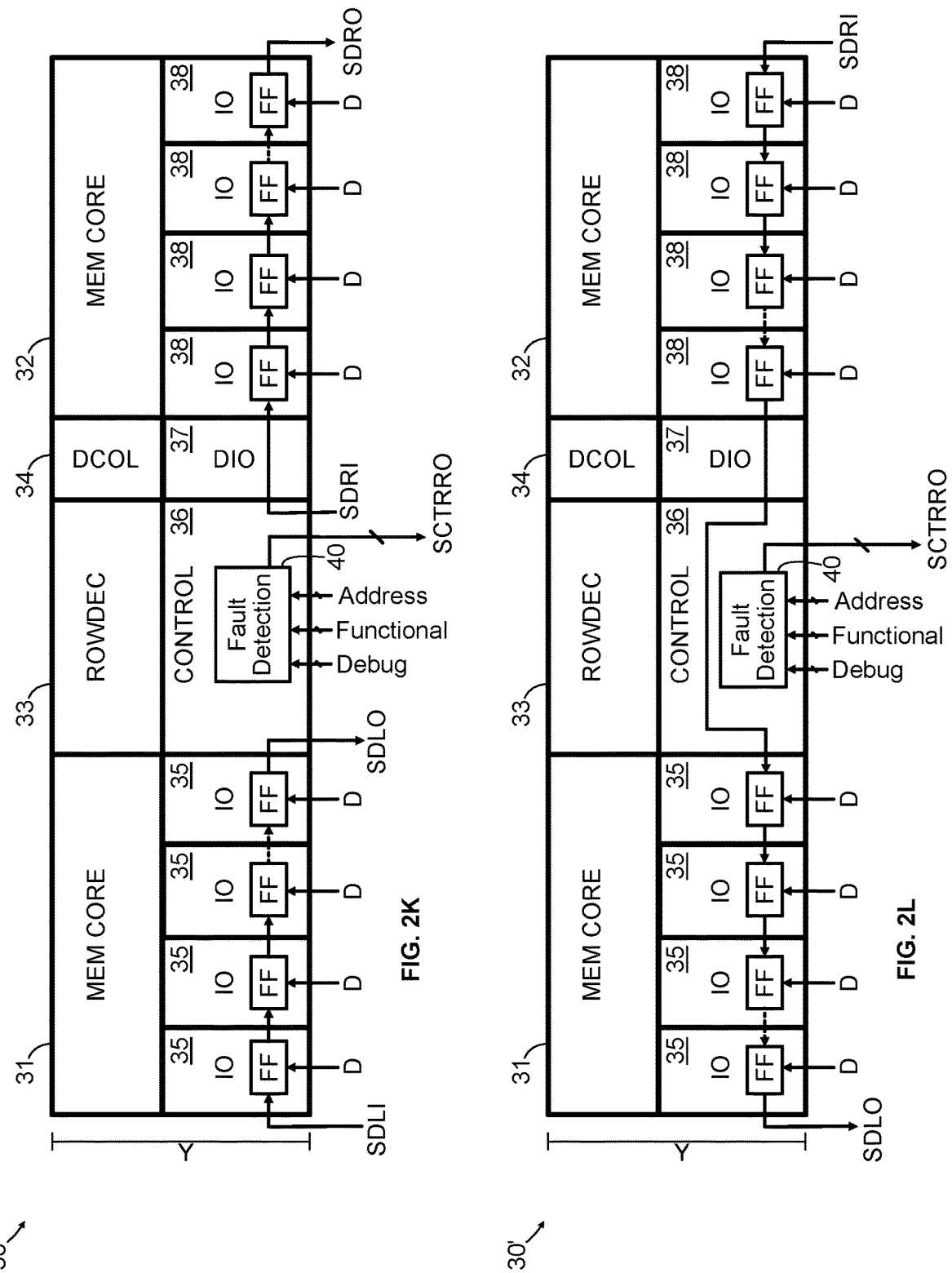

The fault detection block 40 in the control section 36 may lack flip flops used to form scan chains, in an embodiment in which the IO blocks 35 and 38 each have their own outputs during scan testing, as shown in FIG. 2K.

The fault detection block 40 in the control section 36 may lack flip flops used to form scan chains, in an embodiment in which the flip flops of IO blocks 35 and 38 are chained together such that the output of one of the IO blocks is the input to the other IO blocks, as shown in FIG. 2L.

The fault detection block 40 is now described in greater detail with reference to FIG. 3. The fault detection block 40, as shown, includes blocks 41, 42, and 43, with each block including by a 2×1 multiplexer at its input and a flip flop at its output. Block 41 includes a multiplexer 41a receiving inputs from a fault detection logic circuit 44 and the output from the IO block 38, the multiplexer 41a being controlled by the scan mode signal SCAN MODE. A flip flop 41b within the block 41 receives the output of the multiplexer 41a and provides a data output as input to the multiplexer 42a of the block 42. While in this example, the multiplexer 41a receives input from the IO block 38, may be instead receive input from the IO block 35 or SCTRLI.

Block 42 includes a multiplexer 42a receiving inputs from a fault detection logic circuit 45 and the output of block 41, the multiplexer 42a being controlled by the scan mode signal SCAN MODE. A flip flop 42b within the block 42 receives the output of the multiplexer 42a and provides a data output as input to the multiplexer 43a of the block 43.

Block 43 includes a multiplexer 43a receiving inputs from a fault detection logic circuit 46 and the output of block 42, the multiplexer 43a being controlled by a scan mode signal SCAN MODE. A flip flop 43b within the block 43 receives the output of the multiplexer 43a and provides a data output (shown as SDRO/SDLO/SCTRRO, indicating it may be the output for either the IO block 38 or the IO block 35 for scan testing).

Fault detection logic 44 is connected to receive the address inputs, while fault detection logic 45 is connected to receive the functional inputs and fault detection logic 46 is connected to receive the debug inputs.

The purpose of the fault detection logics 44, 45, and 46 is to detect stuck-at faults on their respective inputs. The specific logic performed by the fault detection logics 44, 45, and 46 is to detect whether all of their inputs to a given fault detection logic are identical (referred to herein as an all 1 or all 0 logic detection circuit), output a logic low if so, and otherwise output a logic high.

Since the specific circuit arrangement for the fault detection logics 44, 45, and 46 is not necessary to explain operation, those details will be given at the end. First, operation will be described.

When the scan mode signal SCAN MODE is at a first logic state to cause the multiplexers 41a, 42a, and 43a to pass the outputs of fault detection logics 44, 45, and 46 to the flip flops 41b, 42b, and 43b, stuck-at testing is begun.

To test whether a stuck-at-0 fault is present with the multiple inputs for receiving debug data, the debug data is provided to the fault detection logic 46 as being all logic 1s. If the resulting output of the fault detection logic 46 as held by the flip flop 43b is a logic 0, there is no stuck-at-0 fault, but if the output of the fault detection logic 46 as held by the flip flop 43b is a logic 1, a stuck-at-0 fault is detected.

To test whether a stuck-at-0 fault is present with the multiple inputs for receiving functional data, the functional data is provided to the fault detection logic 45 as being all logic 1s. If the resulting output of the fault detection logic 45 as held by the flip flop 42b is a logic 0, there is no stuck-at-0 fault, but if the output of the fault detection logic 45 as held by the flip flop 42b is a logic 1, a stuck-at-0 fault is detected.

To test whether a stuck-at-0 fault is present with the multiple inputs for receiving address data, the address data is provided to the fault detection logic 44 as being all logic 1s. If the resulting output of the fault detection logic 44 as held by the flip flop 41b is a logic 0, there is no stuck-at-0 fault, but if the output of the fault detection logic 44 as held by the flip flop 41b is a logic 1, a stuck-at-0 fault is detected.

To test whether a stuck-at-1 fault is present with the multiple inputs for receiving debug data, the debug data is provided to the fault detection logic 46 as being all logic 0s. If the resulting output of the fault detection logic 46 as held by the flip flop 43b is a logic 0, there is no stuck-at-1 fault, but if the output of the fault detection logic 46 as held by the flip flop 43b is a logic 1, a stuck-at-1 fault is detected.

To test whether a stuck-at-1 fault is present with the multiple inputs for receiving functional data, the functional data is provided to the fault detection logic 45 as being all logic 0s. If the resulting output of the fault detection logic 45 as held by the flip flop 42b is a logic 0, there is no stuck-at-1 fault, but if the output of the fault detection logic 45 as held by the flip flop 42b is a logic 1, a stuck-at-1 fault is detected.

To test whether a stuck-at-1 fault is present with the multiple inputs for receiving address data, the address data is provided to the fault detection logic 44 as being all logic 0s. If the resulting output of the fault detection logic 44 as held by the flip flop 41b is a logic 0, there is no stuck-at-1 fault, but if the output of the fault detection logic 44 as held by the flip flop 41b is a logic 1, a stuck-at-1 fault is detected.

If a stuck-at-0 fault is detected in the debug inputs but stuck-at-1 faults are not detected in the debug inputs, the stuck-at-0 fault can be pinpointed by setting one (and only one) input to a logic 1, with the other inputs being set to a logic 0, and iterating this until the output of the fault detection logic 46 as held by the flip flop 43b is at a logic 1. For example, assume there are three inputs Debug[0], Debug [1], and Debug[2], and that the stuck-at-0 fault is at the third input Debug[2]. Pinpointing of the stuck-at-0 fault would begin by setting the inputs to be 001; if the output of the fault detection logic 46 is then a logic 0, then the stuck-at-0 fault is not at the first bit. Pinpointing of the stuck-at-0 fault would then continue with setting the inputs to be 010; if the output of the fault detection logic 46 is still a logic 0, then the stuck-at-fault is not at the second bit. Pinpointing of the stuck-at-0 fault would then continue with setting the inputs to be 100; the output of the fault detection logic 46 would then go to a logic 1, and the stuck-at-0 fault is detected as being at the third debug input. For each bit resulting in the output of the detection logic 46 going to a logic 1, it is known that a stuck-at-0 fault is at the corresponding input. Therefore, although in this example one stuck-at-0 fault has been shown and detected, any number of stuck-at-0 faults may be so detected and pinpointed. Observe therefore, that for n debug inputs, n iterations are performed to detect and pinpoint each stuck-at-0 fault.

If a stuck-at-0 fault is detected in the functional inputs but stuck-at-1 faults are not detected in the functional inputs, the stuck-at-0 fault can be pinpointed by setting one (and only one) input to a logic 1, with the other inputs being set to a logic 0, and iterating this until the output of the fault detection logic 45 as held by the flip flop 42*b* is at a logic 1. For example, assume there are three inputs Functional [0], Functional [1], and Functional [2], and that the stuck-at-0 fault is at the third input Functional [2]. Pinpointing of the stuck-at-0 fault would begin by setting the inputs to be 001; if the output of the fault detection logic 45 is then a logic 0, then the stuck-at-0 fault is not at the first bit. Pinpointing of the stuck-at-0 fault would then continue with setting the inputs to be 010; if the output of the fault detection logic 45 is still a logic 0, then the stuck-at-0 fault is not at the second bit. Pinpointing of the stuck-at-0 fault would then continue with setting the inputs to be 100; the output of the fault detection logic 45 would then go to a logic 1, and the stuck-at-0 fault is detected as being at the third functional input. For each bit resulting in the output of the detection logic 45 going to a logic 1, it is known that a stuck-at-0 fault is at the corresponding input. Therefore, although in this example one stuck-at-0 fault has been shown and detected, any number of stuck-at-0 faults may be so detected and pinpointed. Observe therefore, that for n functional inputs, n iterations are performed to detect and pinpoint each stuck-at-0 fault.

If a stuck-at-0 fault is detected in the address inputs but stuck-at-1 faults are not detected in the address inputs, the stuck-at-0 fault can be pinpointed by setting one (and only one) input to a logic 1, with the other inputs being set to a logic 0, and iterating this until the output of the fault detection logic 44 as held by the flip flop 41*b* is at a logic 1. For example, assume there are three inputs Address [0], Address [1], and Address [2], and that the stuck-at-0 fault is at the third input Address [2]. Pinpointing of the stuck-at-0 fault would begin by setting the inputs to be 001; if the output of the fault detection logic 44 is then a logic 0, then the stuck-at-0 fault is not at the first bit. Pinpointing of the stuck-at-0 fault would then continue with setting the inputs to be 010; if the output of the fault detection logic 44 is still a logic 0, then the stuck-at-0 fault is not at the second bit. Pinpointing of the stuck-at-0 fault would then continue with setting the inputs to be 100; the output of the fault detection logic 44 would then go to a logic 1, and the stuck-at-0 fault is detected as being at the third address input. For each bit resulting in the output of the detection logic 44 going to a logic 1, it is known that a stuck-at-0 fault is at the corresponding input. Therefore, although in this example one stuck-at-0 fault has been shown and detected, any number of stuck-at-0 faults may be so detected and pinpointed. Observe therefore, that for n address inputs, n iterations are performed to detect and pinpoint each stuck-at-0 fault.

If a stuck-at-1 fault is detected in the debug inputs but stuck-at-0 faults are not detected in the debug inputs, the stuck-at-1 fault can be pinpointed by setting one (and only one) input to a logic 0, with the other inputs being set to a logic 1, and iterating this until the output of the fault detection logic 46 as held by the flip flop 43*b* is at a logic 1. For example, assume there are three inputs Debug[0], Debug [1], and Debug[2], and that the stuck-at-1 fault is at the third input Debug[2]. Pinpointing of the stuck-at-1 fault would begin by setting the inputs to be 110; if the output of the fault detection logic 46 is then a logic 0, then the stuck-at-1 fault is not at the first bit. Pinpointing of the stuck-at-1 fault would then continue with setting the inputs to be 101; if the output of the fault detection logic 46 is still a logic 0, then the stuck-at-1 fault is not at the second bit. Pinpointing of the stuck-at-1 fault would then continue with setting the inputs to be 011; the output of the fault detection logic 46 would then go to a logic 1, and the stuck-at-1 fault is detected as being at the third debug input. For each bit resulting in the output of the detection logic 46 going to a logic 1, it is known that a stuck-at-1 fault is at the corresponding input. Therefore, although in this example one stuck-at-1 fault has been shown and detected, any number of stuck-at-1 faults may be so detected and pinpointed. Observe therefore, that for n debug inputs, n iterations are performed to detect and pinpoint each stuck-at-1 fault.

If a stuck-at-1 fault is detected in the functional inputs but stuck-at-0 faults are not detected in the functional inputs, the stuck-at-1 fault can be pinpointed by setting one (and only one) input to a logic 0, with the other inputs being set to a logic 1, and iterating this until the output of the fault detection logic 45 as held by the flip flop 42*b* is at a logic 1. For example, assume there are three inputs Functional [0], Functional [1], and Functional [2], and that the stuck-at-1 fault is at the third input Functional [2]. Pinpointing of the stuck-at-1 fault would begin by setting the inputs to be 110; if the output of the fault detection logic 45 is then a logic 0, then the stuck-at-1 fault is not at the first bit. Pinpointing of the stuck-at-1 fault would then continue with setting the inputs to be 101; if the output of the fault detection logic 45 is still a logic 0, then the stuck-at-1 fault is not at the second bit. Pinpointing of the stuck-at-1 fault would then continue with setting the inputs to be 011; the output of the fault detection logic 45 would then go to a logic 1, and the stuck-at-1 fault is detected as being at the third functional input. For each bit resulting in the output of the detection logic 45 going to a logic 1, it is known that a stuck-at-1 fault is at the corresponding input. Therefore, although in this example one stuck-at-1 fault has been shown and detected, any number of stuck-at-1 faults may be so detected and pinpointed. Observe therefore, that for n functional inputs, n iterations are performed to detect and pinpoint each stuck-at-1 fault.

If a stuck-at-1 fault is detected in the address inputs but stuck-at-0 faults are not detected in the address inputs, the stuck-at-1 fault can be pinpointed by setting one (and only one) input to a logic 0, with the other inputs being set to a logic 1, and iterating this until the output of the fault detection logic 44 as held by the flip flop 41 is at a logic 1. For example, assume there are three inputs Address [0], Address [1], and Address [2], and that the stuck-at-1 fault is at the third input Address [2]. Pinpointing of the stuck-at-1 fault would begin by setting the inputs to be 110; if the output of the fault detection logic 44 is then a logic 0, then the stuck-at-1 fault is not at the first bit. Pinpointing of the stuck-at-1 fault would then continue with setting the inputs to be 101; if the output of the fault detection logic 44 is still a logic 0, then the stuck-at-1 fault is not at the second bit. Pinpointing of the stuck-at-1 fault would then continue with setting the inputs to be 011; the output of the fault detection logic 44 would then go to a logic 1, and the stuck-at-1 fault is detected as being at the third address input. For each bit resulting in the output of the detection logic 44 going to a logic 1, it is known that a stuck-at-1 fault is at the corresponding input. Therefore, although in this example one stuck-at-1 fault has been shown and detected, any number of stuck-at-1 faults may be so detected and pinpointed. Observe therefore, that for n address inputs, n iterations are performed to detect and pinpoint each stuck-at-1 fault.

It is therefore evident that through the use of the fault detection logics 44, 45, and 46, any number of, and any combination of, stuck-at faults may be detected. If only stuck-at-1 (and no stuck-at-0) faults are present in a given set of input pins, any number of such stuck-at-1 faults may be detected and pinpointed, and if only stuck-at-0 (and no stuck-at-1) faults are detected in a given set of input pins, any number of such stuck-at-0 faults may be detected and pinpointed, without the additional area overhead of using a separate flip flop for each input to the control section 36.

Alternative configurations are possible. For example, see FIG. 3A in which there is but one fault detection logic 44' which receives each of the address, functional, and debug inputs. Here therefore, there is but a single multiplexer 41*a* and single flip flop 41*b*. This design may save area as opposed to the design of FIG. 3, albeit at the cost of being unable to pinpoint stuck-at-0 faults on any input (regardless of whether address, functional, or debug) if a stuck-at-1 fault is present on any other input, and being unable to pinpoint stuck-at-1 faults on any input (regardless of whether address, functional, or debug) if a stuck-at-0 fault is present on any other input.

As another alternative, see FIG. 3B in which there are multiple fault detection logics for each class of inputs. For example, there are two fault detection logics 44 and 154 for address inputs, two fault detection logics 45 and 174 for functional inputs, and two fault detection logics 46 and 194 for debug inputs. While this design consumes more area than that of FIG. 3, it does provide for greater ability to pinpoint stuck-at faults. For example, the presence of a stuck-at-1 fault on one of the address inputs to fault detection logic 44 would not stop pinpointing of a stuck-at-0 fault on one of the address inputs to fault detection logic 154, while the presence of a stuck-at-0 fault on one of the address inputs to the fault detection logic 44 would not stop pinpointing of a stuck-at-1 fault on one of the address inputs to fault detection logic 154.

Recall the embodiments of FIGS. 2J-2L in which the fault detection block 40 in the control section 36 lacks flip flops used to form scan chains. Potential configurations for the fault detection blocks 40 in those embodiments are shown in FIGS. 3C-3H.

Figure 3C:
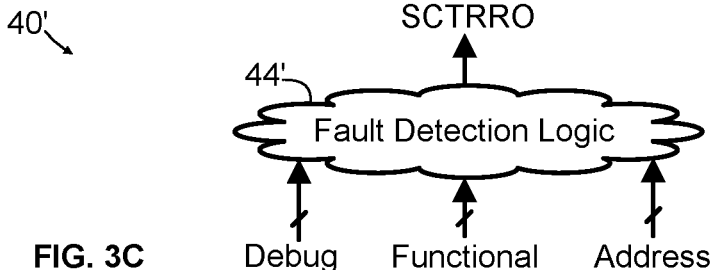
Figure 3D:
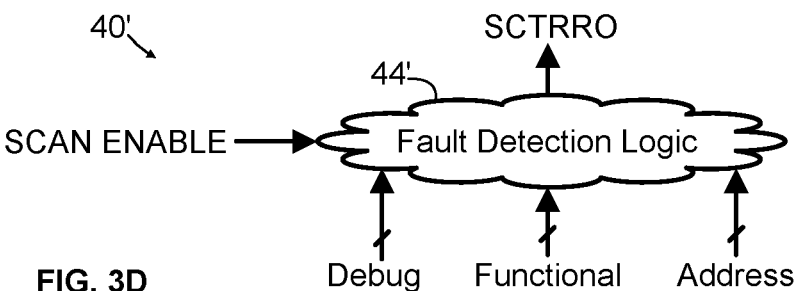

For example, observe the configuration of FIG. 3C in which the fault detection block 40 lacks flip flops and in which there is but one fault detection logic 44' which receives each of the address, functional, and debug inputs. As an option, in this configuration, the fault detection logic 44' may be enabled by a received scan enable signal SCAN ENABLE, as shown in FIG. 3D.

Figure 3E:
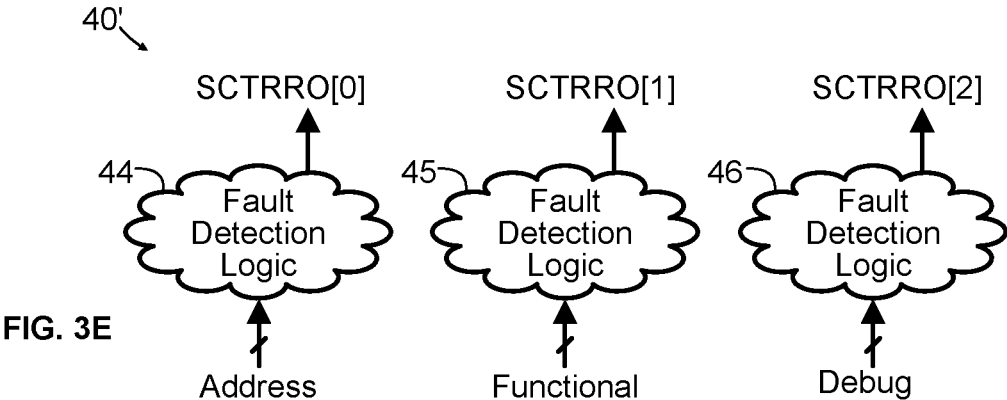
Figures 3F, 3G, 3H:
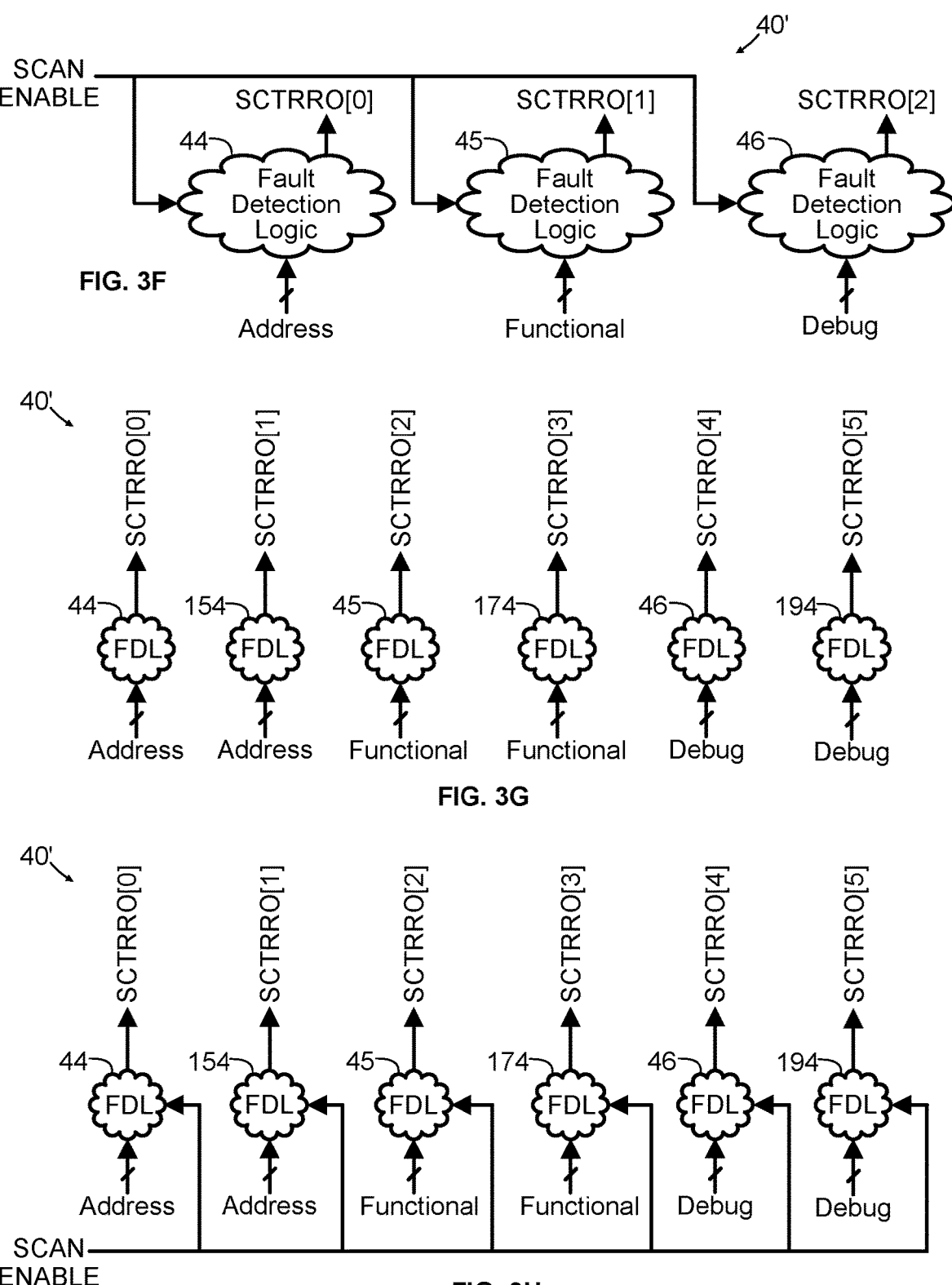

In another potential configuration in which the fault detection block 40 lacks flip flops, there may be one fault detection logic per input pin type. As shown in FIG. 3E, there may be a fault detection logic 44 for the address inputs, a fault detection logic 45 for the functional inputs, and a fault detection logic 46 for the debug inputs. Here as well, the fault detection logics 44, 45, 46 may be enabled by a received scan enable signal SCAN ENABLE, as shown in FIG. 3F.

In yet another potential configuration in which the fault detection block 40 lacks flip flops, there may be multiple fault detection logics for each class of inputs. As shown in FIG. 3G, there are two fault detection logics 44 and 154 for address inputs, two fault detection logics 45 and 174 for functional inputs, and two fault detection logics 46 and 194 for debug inputs. Here too, the fault detection logics 44, 154, 45, 174, 46, and 194 may be enabled by a received scan enable signal SCAN ENABLE, as shown in FIG. 3H.

In the designs of FIGS. 3C-3H, operation for fault detection proceeds as described above, albeit with the output SCTRRO of the fault detection block 40 being directly provided from the fault detection logic(s).

Figures 4A, 4B, 4C:
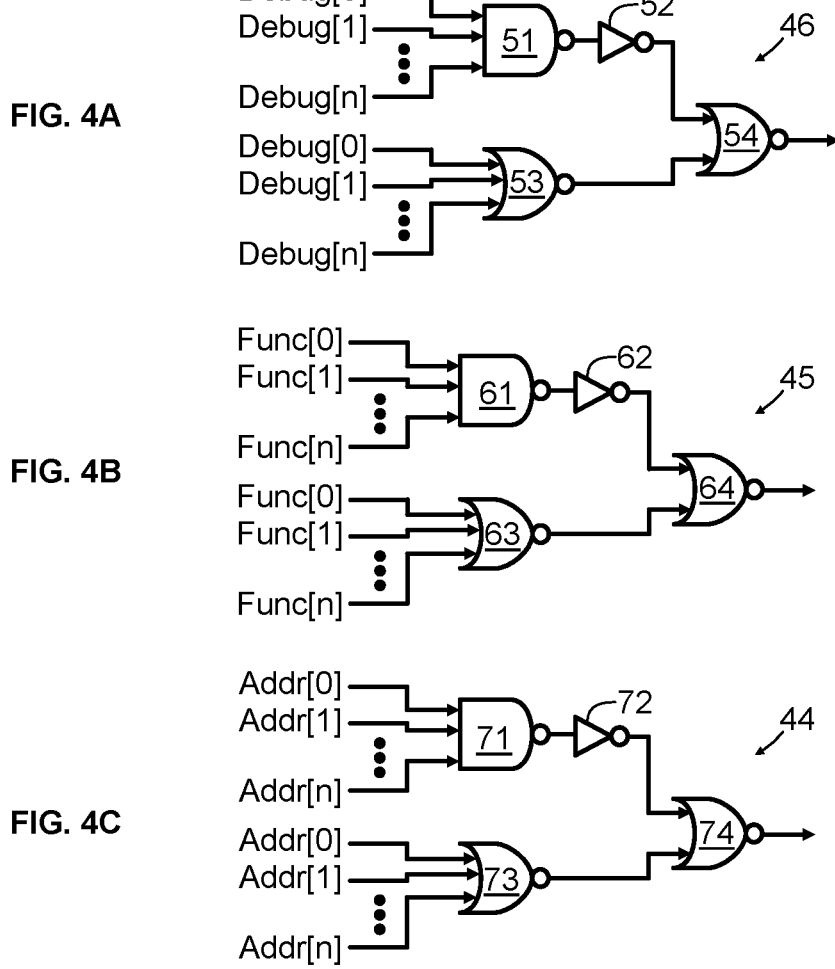
FIGS. 4A-4C are schematic block diagrams of the fault detection logic circuits within the fault detection block of FIG. 3 and FIGS. 3A-3H.

Example designs for the fault detection logics themselves are shown in FIGS. 4A-4C respectively. As stated, the fault detection logics detect whether all of their inputs are identical, output a logic low if so, and otherwise output a logic high. Note that this is not a logical XOR operation and is not a logical XNOR operation and that a logic XOR gate or a logic XNOR gate will not perform this functionality.

The following examples will be given with reference to fault detection logics 44, 45, and 46, but it should be understood that any of such examples may be used for any fault detection logic described above.

The fault detection logic 46, as shown in FIG. 4A, includes a NAND gate 51 receiving each bit of the debug input at its inputs (these bits shown as Debug[0], . . . , Debug[n] to represent any number n of debug inputs) and providing output to the input an inverter 52, which in turn provides its output to an input of NOR gate 54. The fault detection logic 46 also includes a NOR gate 53 receiving each bit of the debug input at its inputs and providing output to the input of NOR gate 54. The output of the NOR gate 54 is therefore a logic 0 when all inputs to both NAND gate 51 and NOR gate 53 are the same and is otherwise a logic 1. This design could also be used for fault detection logics 44 and 45 of FIG. 3, for example.

The fault detection logic 45, as shown in FIG. 4B, includes a NAND gate 61 receiving each functional input at its inputs (these bits shown as Func[0], . . . , Func[n] to represent any number n of functional inputs) and providing output to the input an inverter 62, which in turn provides its output to an input of NOR gate 64. The fault detection logic 45 also includes a NOR gate 63 receiving each bit of the debug input at its inputs and providing output to the input of NOR gate 64. The output of the NOR gate 64 is therefore a logic 0 when all inputs to both NAND gate 61 and NOR gate 63 are the same and is otherwise a logic 1. This design could also be used for fault detection logics 44 and 46 of FIG. 3, for example.

The fault detection logic 44, as shown in FIG. 4C, includes a NAND gate 71 receiving the address bits at its inputs (these bits shown as Addr[0], . . . , Addr[n] to represent any number n of address bits) and providing output to the input an inverter 72, which in turn provides its output to an input of NOR gate 74. The fault detection logic 44 also includes a NOR gate 73 receiving each bit of the debug input at its inputs and providing output to the input of NOR gate 74. The output of the NOR gate 74 is therefore a logic 0 when all inputs to both NAND gate 71 and NOR gate 73 are the same and is otherwise a logic 1. This design could also be used for fault detection logics 45 and 46 of FIG. 3, for example.

Figures 5A, 5B:
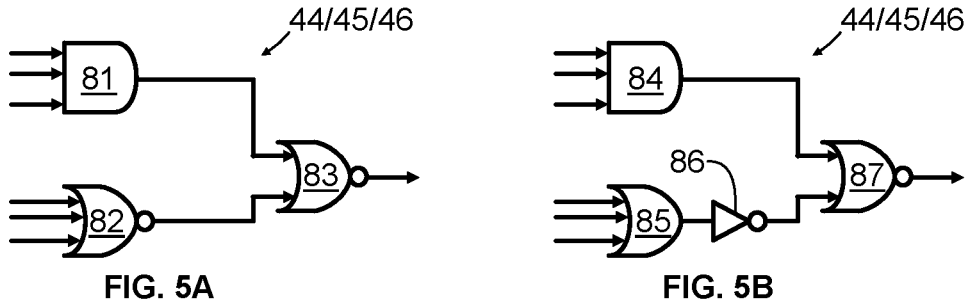
FIGS. 5A-5E are schematic block diagrams of alternative designs for the fault detection logic circuits within the fault detection block FIGS. 3 and 3A-3H that may be used instead of the fault detection logic circuits of FIGS. 4A-4C.

Alternative configurations for the fault detection logics 44, 45, and 46 are shown in FIGS. 5A-5E. For example, as shown in FIG. 5A, the fault detection logics 44, 45, and 46 may each include an AND gate 81 receiving each input bit as input and providing output to the input of NOR gate 83, with a NOR gate 82 also receiving each input bit as input and providing output to the NOR gate 83. The output of the NOR gate 83 is a logic 0 when all inputs to both AND gate 81 and NOR gate 82 are the same and is otherwise a logic 1.

Another example is shown in FIG. 5B, in which the fault detection logics 44, 45, and 46 each include an AND gate 84 receiving each input bit as input and providing output to the input of NOR gate 87, with a NOR gate 85 also receiving each input bit as input and providing output to the NOR gate 87 through inverter 86. The output of the NOR gate 87 is a logic 0 when all inputs to both AND gate 84 and NOR gate 85 are the same and is otherwise a logic 1.

Figures 5C, 5D:
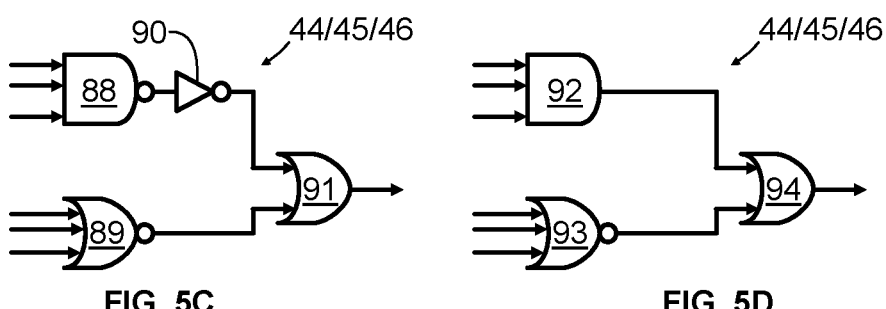

A further example is shown in FIG. 5C, in which the fault detection logics 44, 45, and 46 each include a NAND gate 88 receiving each input bit as input and providing output to the input of OR gate 91 through inverter 90, with a NOR gate 89 also receiving each input bit as input and providing output to the OR gate 91. The output of the OR gate 91 is a logic 1 when all inputs to both NAND gate 88 and NOR gate 89 are the same and is otherwise a logic 0.

An additional example is shown in FIG. 5D, in which the fault detection logics 44, 45, and 46 each include an AND gate 92 receiving each input bit as input and providing output to the input of OR gate 94, with a NOR gate 93 also receiving each input bit as input and providing output to the OR gate 94. The output of the OR gate 94 is a logic 1 when all inputs to both AND gate 92 and NOR gate 93 are the same and is otherwise a logic 0.

Figure 5E:
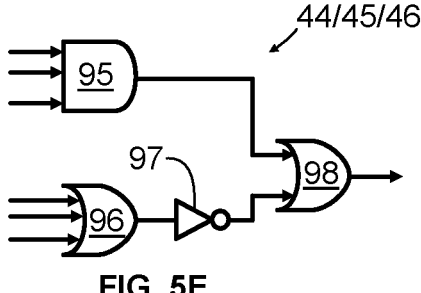

A still further example is shown in FIG. 5E, in which the fault detection logics 44, 45, and 46 each include an AND gate 95 receiving each input bit as input and providing output to the input of OR gate 98, with a NOR gate 96 also receiving each input bit as input and providing output to the OR gate 98 through inverter 97. The output of the OR gate 98 is a logic 1 when all inputs to both AND gate 95 and NOR gate 96 are the same and is otherwise a logic 0.

Appreciate that these are but examples. Any logic circuitry that produces a logic 0 output when all inputs are the same but otherwise produces a logic 1 is usable and within the scope of this disclosure. Likewise, any logic circuitry that produces a logic 1 output when all inputs are the same but otherwise produces a logic 0 is usable and within the scope of this disclosure.

In the above, any described debug, functional, or address input may be received directly from an associated pin (e.g., debug input pin, functional input pin, address input pin), and the fault detection described above functions to detect faults introduced at those pins themselves.

Finally, it is evident that modifications and variations can be made to what has been described and illustrated herein without departing from the scope of this disclosure.

Although this disclosure has been described with a limited number of embodiments, those skilled in the art, having the benefit of this disclosure, can envision other embodiments that do not deviate from the disclosed scope. Furthermore, skilled persons can envision embodiments that represent various combinations of the embodiments disclosed herein made in various ways.

The invention claimed is:

1. A memory system, comprising:
   a left memory bank;
   a left input/output block aligned with said left memory bank for handling data input and output for the left memory bank;
   a right memory bank;
   a right input/output block aligned with said right memory bank for handling data input and output for the right memory bank;

a row decoder situated between the left memory bank and the right memory bank and configured to select a specific row within the left memory bank and/or the right memory bank based on an address input;

a control section situated between said left and right input/output blocks for managing memory operations, receiving control signals including address signals, functional commands, and debug commands and data, and performing stuck-at testing; and a fault detection logic within said control section configured to output a first logic value if all of its external inputs are identical and output a second logic value if not, the fault detection logic further configured to detect and locate stuck-at faults in the external inputs to the fault detection logic by:

performing stuck-at-0 testing by receiving each of the external inputs as the second logic value and observing whether the output of the fault detection logic is the second logic value; and performing stuck-at-1 testing by receiving each of the external inputs as the first logic value and observing whether the output of the fault detection logic is the second logic value.

2. The memory system of claim 1, wherein the fault detection logic is further configured to:
   pinpoint stuck-at-0 faults by iteratively changing input values at each of the external inputs and observing the output of the fault detection logic.

3. The memory system of claim 2, wherein iteratively changing the input values to pinpoint stuck-at-0 faults is performed by receiving one input value as the second logic value and a remainder of the input values as the first logic value, observing the output of the fault detection logic, and iterating which one of the input values is at the second logic value.

4. The memory system of claim 1, wherein the fault detection logic is further configured to:
   pinpoint stuck-at-1 faults by iteratively changing input values at each of the external inputs and observing the output of the fault detection logic.

5. The memory system of claim 4, wherein iteratively changing the input values to pinpoint stuck-at-1 faults is performed by receiving one input value as the first logic value and a remainder of the input values as the second logic value, observing the output of the fault detection logic, and iterating which one of the input values is at the first logic value.

6. The memory system of claim 1, wherein the fault detection logic comprises:
   a NAND gate having inputs connected to each of the external inputs and an output;
   a first NOR gate having inputs also connected to each of the external inputs and an output;
   an inverter having an input connected to the output of the NAND gate and an output; and
   a second NOR gate having inputs connected to the outputs of the inverter and the first NOR gate, wherein an output of the second NOR gate forms the output of the fault detection logic.

7. The memory system of claim 1, wherein the fault detection logic comprises:
   an AND gate having inputs connected to each of the external inputs and an output;
   a first NOR gate having inputs also connected to each of the external inputs and an output; and a second NOR gate having inputs connected to the outputs of the AND gate and the first NOR gate, wherein an output of the second NOR gate forms the output of the fault detection logic.

8. The memory system of claim 1, wherein the fault detection logic comprises:

an AND gate having inputs connected to each of the external inputs and an output;

an OR gate having inputs also connected to each of the external inputs and an output;

an inverter having an input connected to the output of the OR gate and an output; and a NOR gate having inputs connected to the outputs of the inverter and the AND gate, wherein an output of the NOR gate forms the output of the fault detection logic.

9. The memory system of claim 1, wherein the fault detection logic comprises:

a NAND gate having inputs connected to each of the external inputs and an output;

a NOR gate having inputs also connected to each of the external inputs and an output;

an inverter having an input connected to the output of the NAND gate and an output; and an OR gate having inputs connected to the outputs of the inverter and the NOR gate, wherein an output of the OR gate forms the output of the fault detection logic.

10. The memory system of claim 1, wherein the fault detection logic comprises:

an AND gate having inputs connected to each of the external inputs and an output;

a NOR gate having inputs also connected to each of the external inputs and an output; and an OR gate having inputs connected to the outputs of the AND gate and the NOR gate, wherein an output of the OR gate forms the output of the fault detection logic.

11. The memory system of claim 1, wherein the fault detection logic comprises:

an AND gate having inputs connected to each of the external inputs and an output;

an OR gate having inputs also connected to each of the external inputs and an output;

an inverter having an input connected to the output of the OR gate and an output; and an OR gate having inputs connected to the outputs of the inverter and the AND gate, wherein an output of the OR gate forms the output of the fault detection logic.

12. The memory system of claim 1, wherein the external inputs include debug input pins, functional input pins, and/or address input pins.

13. The memory system of claim 1, wherein: either the first logic value is a logic low and the second logic value is a logic high, or the first logic value is a logic high and the second logic value is a logic low.

14. A method for testing a memory device including a first memory core, a first IO block associated with the first memory core, a row decoder, and a control block, the method comprising:

performing stuck-at-0 testing using a fault detection circuit within the control block by causing each input value to the fault detection circuit, including address inputs provided to the row decoder, to be set to a second logic value so that the fault detection circuit outputs a first logic value to indicate a lack of a stuck-at-0 fault but otherwise outputs the second logic value to indicate a stuck-at-0 fault;

performing stuck-at-1 testing using the fault detection circuit by causing each input value to the fault detection circuit, including the address inputs provided to the row decoder, to be set to the first logic value so that the fault detection circuit outputs the first logic value to indicate a lack of a stuck-at-1 fault but otherwise outputs the second logic value to indicate a stuck-at-1 fault;

if stuck-at-1 faults are not indicated, pinpointing indicated stuck-at-0 faults by iteratively changing the input values, including the address inputs provided to the row decoder, and observing the output of the fault detection circuit; and if stuck-at-0 faults are not indicated, pinpointing indicated stuck-at-1 faults by iteratively changing the input values, including the address inputs provided to the row decoder, and observing the output of the fault detection circuit.

15. The method of claim 14, wherein pinpointing the indicated stuck-at-0 faults includes setting one input value to the second logic value and other input values to the first logic value, then iterating until the output of the fault detection circuit changes to the second logic value.

16. The method of claim 14, wherein pinpointing the indicated stuck-at-1 faults includes setting one input value to the first logic value and other input values to the second logic value, then iterating until the output of the fault detection logic circuit changes to the second logic value.

17. The method of claim 14, further comprising receiving an output of a final flip flop in a scan chain of one of the IO block at the control block and shifting that output out through an external output during scan testing of the IO block.

18. The method of claim 14, wherein: either the first logic value is a logic low and the second logic value is a logic high, or the first logic value is a logic high and the second logic value is a logic low.

19. A memory device, comprising:

a first memory core;

a first input/output (IO) block associated with the first memory core, the first IO block including flip flops configurable into a scan chain;

a row decoder configured to select a specific row within the first memory core based on address inputs; and a control block comprising:

first fault detection logic connected to receive external inputs and configured to deassert its output when each external input has a same logic value but otherwise assert its output;

a first flip flop having a data input and a data output; and a first multiplexer configured to pass either an output of the scan chain of the first IO block or the output of the first fault detection logic to the data input of the first flip flop, responsive to a scan mode signal.

20. The memory device of claim 19, wherein the external inputs include debug input pins, functional input pins, and/or address input pins.

21. The memory device of claim 20, wherein the data output of the first flip flop is connected to an external output.

22. The memory device of claim 19, further comprising:

a second memory core; and a second IO block associated with the second memory core, the second IO block including flip flops configurable into a scan chain;

wherein an output of a last flip flop in the scan chain of the second IO block is connected to an external output.

23. The memory device of claim 19, wherein the external inputs also include debug inputs and functional inputs;

wherein the first fault detection logic is connected to receive the address inputs and the output of the first fault detection logic is indicative of whether a stuck-at fault is present in the address inputs; and wherein the control block further comprises:

second fault detection logic connected to receive the functional inputs and configured to deassert its output when each functional input has a same logic value but otherwise assert its output;

a second flip flop having a data input and a data output;

a second multiplexer configured to pass either the data output of the first flip flop or the output of the second fault detection logic to the data input of the second flip flop, responsive to the scan mode signal;

third fault detection logic connected to receive the debug inputs and configured to deassert its output when each debug input has a same logic value but otherwise assert its output;

a third flip flop having a data input and a data output; and a third multiplexer configured to pass either the data output of the second flip flop or the output of the third fault detection logic to the data input of the third flip flop, responsive to the scan mode signal;

wherein the data output of the third flip flop is connected to an external output.

\* \* \* \* \*